United States Patent [19]

Braun

[11] 3,970,920

[45] July 20, 1976

[54] MEASURING ARRANGEMENT FOR AN APPARATUS FOR ELECTROSTATIC COATING OF GROUNDED OBJECTS FOR MEASURING THE GROUND RESISTENCE

[75] Inventor: Franz Braun, Staad, Switzerland

[73] Assignee: Gema AG Apparatebau, St. Gall, Switzerland

[22] Filed: Mar. 24, 1975

[21] Appl. No.: 561,413

Related U.S. Application Data

[63] Continuation of Ser. No. 342,857, March 19, 1973, abandoned.

[30] Foreign Application Priority Data

Mar. 22, 1972 Switzerland.......................... 4217/72

[52] U.S. Cl.................................... 324/32; 317/3; 324/71 R
[51] Int. Cl.² ..................... G01R 5/28; G01N 27/00
[58] Field of Search..................... 324/71 R, 72, 32; 118/9; 117/93.4 R; 317/3

[56] References Cited

UNITED STATES PATENTS

| 3,787,707 | 1/1974 | Gregg | 317/3 |
| R28,394 | 4/1975 | Point | 324/32 X |

FOREIGN PATENTS OR APPLICATIONS

| 2,045,678 | 9/1969 | Germany | 317/3 |

*Primary Examiner*—John K. Corbin
*Assistant Examiner*—Rolf Hille

[57] ABSTRACT

A measuring arrangement for an apparatus for electrostatic coating of grounded objects for measuring the ground or earthing resistance thereof, and wherein the objects are moved past the apparatus. An electrode is arranged in front of the apparatus, viewed in the object conveying direction, and this electrode is intended to influence the electrical potential of the object without contacting the same. There is also provided a measuring circuit which is electrically coupled with such electrode or with an electrostatic or induction electrode also arranged in front of the apparatus.

10 Claims, 6 Drawing Figures

MEASURING ARRANGEMENT FOR AN APPARATUS FOR ELECTROSTATIC COATING OF GROUNDED OBJECTS FOR MEASURING THE GROUND RESISTENCE

This is a continuation of application Ser. No. 342,857 filed Mar. 19, 1973, now abandoned.

BACKGROUND OF THE INVENTION

The present invention relates to a new and improved measuring arrangement for an apparatus for electrostatic coating of grounded objects for the purpose of measuring the ground or earthing resistance.

In all those techniques where objects or articles are electrostatically coated it is of particular importance that the objects are properly grounded so that there is maintained the potential difference between the electrostatically charged particles of the coating material and the objects. Furthermore, grounding of the objects is undertaken to prevent such from becoming charged by the coating operation itself and thus impairing the safety of the operating personnel.

In conjunction with equipment for electrostatic coating the ground resistance was previously determined by periodically carrying out direct resistance measurement operations. In other words by contacting the object there was impressed thereon a certain potential and the current flowing through the object to ground was measured. In this way it was possible to easily determine the ground or earthing resistance. As simple as this measuring technique appears to be it has been found to possess considerable drawbacks when employed in connection with automatic coating installations where the objects are conveyed past the coating nozzle. Firstly, the objects moved by means of a conveying device past the coating apparatus are themselves grounded via the conveying device. This conveying device itself necessarily possesses mechanically moved components and it is so-to-speak unavoidable that with time there are formed at such components scale and lubricant layers. As a result, at least when working with low voltages, there is influenced the quality of the electrical contact between the objects transported by the conveyor and ground. The heretofore employed conventional techniques in such instances not only occasionally delivered values of the ground resistance but such values were unreliable if, owing to contact of the object, there was impressed thereon a relatively low voltage which was not capable of penetrating through the insulating scale- and lubricating film.

The quality of the electrostatic coating is however also dependent upon the value of the ground resistance at high voltages at the region of the coating apparatus. If a direct ground resistance measurement is undertaken at the region of the coating apparatus then, as already mentioned, the object must be contacted in order to apply thereat a relatively low voltage corresponding to the ohmic measurement circuit. Apart from the fact that when working with this technique it is not possible to determine any reliable value for the ground resistance it is further to be noted that at the point of contact it is not possible to carry out any, or at the very best, a less compact coating, and therefore there is required a subsequent touching-up of the blank or else locations will appear which have been insufficiently coated.

SUMMARY OF THE INVENTION

Hence it is a primary object of the present invention to provide an improved measuring arrangement for electrostatic coating equipment for measuring the ground resistance and which measuring arrangement is not associated with the aforementioned drawbacks and limitations of the heretofore known state-of-the-art systems.

Another and more specific object of the present invention relates to a new and improved construction of measuring arrangement of the previously mentioned type, by means of which it is possible to carry out an indirect measurement of the ground resistance of the objects at the region of the coating apparatus, and specifically under electrical conditions which for the most part can be compared to those which occur during the coating operation.

Another object of this invention relates to a new and improved construction of measuring arrangement enabling contactless determination of electrical values at relatively high voltages and from which there can be derived the ground or earthing resistance.

Now in order to implement these and still further objects of the invention which will become more readily apparent as the description proceeds, the invention contemplates the provision of a measuring arrangement at an apparatus for the electrostatic coating of grounded objects for measuring the ground resistance thereof and wherein the objects are moved past the apparatus. According to the invention there is provided an electrode which is arranged in front of the electrostatic coating apparatus, viewed in the direction of conveying of the objects, and which is intended to influence the electrical potential of the objects without contacting the same. Further, there is provided a measurement circuit whict is coupled with this electrode or with an electrostatic or induction electrode which is likewise arranged in front of the electrostatic coating apparatus.

According to a variant embodiment of the invention wherein the electrode is coupled with the measurement circuit, it is possible to derive with sufficient accuracy the value of the ground or earthing resistance from the continuous value of the current which departs from such electrode and which tends to adjust itself following an initial maximum value.

In the case of a constructional embodiment wherein the measurement circuit is coupled with an induction electrode a certain electrical potential is impressed upon the objects by means of the electrode. If the objects are capable of retaining such potential during a longer period of time then this is characteristic of the fact that the ground resistance possesses too great a value. In such case the induction electrode, considered in its broader aspects, serves to determine the potential assumed by the object, and wherein the induction electrode can constitute a component of a field intensity-measuring device.

The induction electrode can be designed in the form of a tip or point and can collect the field lines emanating from the charged object, and therefore can reach a potential which is dependent upon the potential of the object (and upon its spatial extent and its spacing). This potential of the tip then can be directly measured or through the agency of a voltage divider and the ground resistance can be derived therefrom.

The induction or influence electrode can be, however, also constructed as a plate and, according to one of the most simple constructional embodiments, forms one electrode of a plate capacitor, the other electrode of which is formed by the object itself. Consequently, the plate assumes a potential by induction which is dependent upon the spacing to the object, its spatial extent and the inherent dimensions and again the residual potential of the object. Also this potential of the plate can be measured directly or via a voltage divider and there can be again derived therefrom the ground resistance of the object.

The induction electrode can be however also constituted by the electrode system of an induction-E-field meter, for instance of the type disclosed by Schwenkhagen (compare for instance "Archiv fuer technisches Messen" (ATN), Volume 413, June 1970, R 62–63), the measurement circuit of which is directly calibrated with respect to the field strength of the field emanating from the object, and which in turn is dependent upon the potential of the object and also the value of the ground or earthing resistance.

Finally, the induction electrode also can be connected in circuit with a contactless discharge circuit of an ionization chamber in which a radioactive source, for instance an alpha- or beta- radiation source, generates an ionized atmosphere with practically constant ion concentration, and wherein such ionization chamber is impinged by the electrical field emanating from the object. This electrical field, depending upon its field intensity, accelerates or retards an ionic current present in the ionization chamber and this current is measured via the induction electrode. The electrical current generated from the ionic current constitutes a measure for the potential of the object, therefore also — indirectly — a measure for the value of its ground or earthing resistance.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Figure 1:
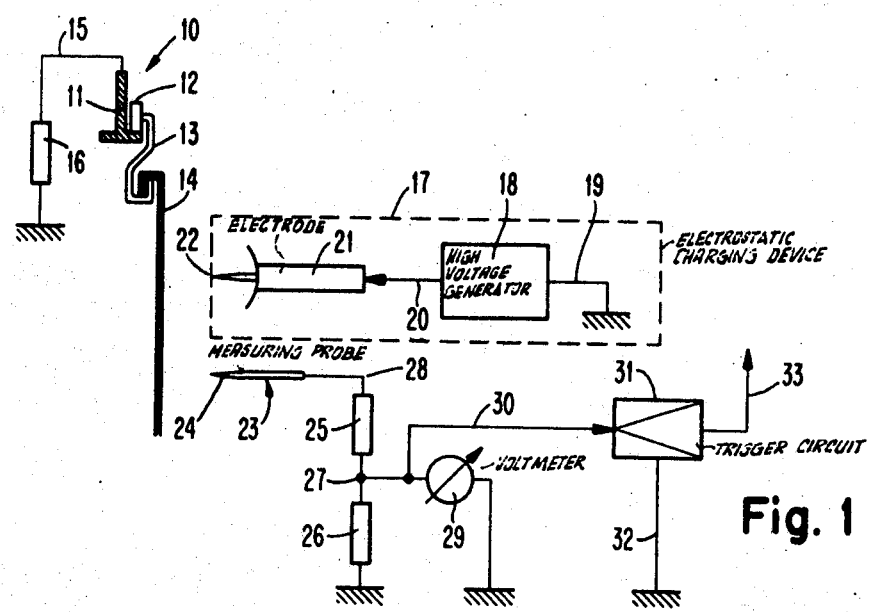
FIG. 1 schematically illustrates a first exemplary embodiment of measuring or measurement arrangement wherein as far as the coating apparatus is concerned there has only been conveniently illustrated the conveyor and the objects to be coated which are conveyed thereby.

Turning now to the drawings it is first of all mentioned that throughout the various Figures the same or analogous components have been generally designated by the same reference characters. In FIG. 1 there has been depicted a suspension or overhead conveyor 10 with a rail 11 at which hooks 13 provided with rollers 12 are displaced in a direction which is perpendicular to the plane of the drawing. Objects or the like, here for instance in the form of plates 14, are suspended at the hooks 13 and these objects 14 are transported by means of the conveyor 10 past the non-illustrated coating apparatus in order to be coated at that location at all sides with a suitable coating material, as is well known in the art. The suspension or overhead conveyor 10 is grounded and this has been conveniently indicated by the conductor 15. Since transfer or passive resistances cannot be avoided on the one hand between the plates 14 and the hooks 13, the hooks 13 and the rollers 12 as well as the rollers 12 and the rail 11, then, considered in the electrical sense, an electrical resistance — the ground or earthing resistance — prevails between the plates 14 and ground and which has been indicated in FIG. 1 by reference character 16.

An electrostatic charging apparatus 17 is arranged opposite the path of travel of the plates 14, the purpose of which is to electrostatically charge these plates 14. The charging apparatus 17 essentially possesses a high-voltage generator 18, the one output terminal of which is connected to ground via the line or conductor 19, whereas the other terminal is connected via a conductor or line 20 with a corona or spray electrode 21 which has one or a number of corona discharge tips 22. The high-voltage generator 18 is preferably designed so that it can be controlled with respect to its output voltage, so that the potential or voltage carried by the corona discharge electrode 21 can be regulated in such a manner that there positively does not occur any spark-over between the discharge tips 22 and the plate 14, something which in the first instance is dependent upon the spacing between the plates 14 and the tip or tips 22 as well as the configuration of the plates 14. On the other hand, the radius of curvature of the discharge tip 22 is chosen such that already with relatively low voltages there occurs a corona discharge, that is to say, there are present free charge carriers which migrate to the plate 14. As the high-voltage generator 18 there can be used to advantage a controllable DC-voltage generator which can be regulated with respect to its output voltage in a range between about 10 kV and about 70 kV.

The electrostatic charging apparatus 17 has associated therewith a measuring probe 23 provided with a tip 24, this measuring probe 23 being connected with ground through the agency of a conductor 28 and a voltage divider formed by two resistors 25 and 26. The junction or tap 27 of the voltage divider 25, 26 is likewise connected with ground via a high-ohm voltmeter 29 and via a conductor 30 with a trigger circuit 31 which is designed such that upon exceeding a predetermined voltage at the conductor 30 there is delivered an output signal which activates an alarm mechanism via the conductor 33 and/or switches-off the non-depicted coating apparatus. The trigger circuit 31 receives its reference voltage from ground via conductor 32.

The mode of operation of the arrangement depicted in FIG. 1 is as follows: as long as no plate 14 is located opposite the tip 22 then most of the field lines which emanate from the tip 22 wander to the next closest point of low potential, that is to the tip 24. After a short period of time such will assume a potential with respect to ground which is dependent upon the resistors 25, 26, with the result that at the junction or tap 27 there appears a voltage which can be read-off the voltmeter 29. This corresponds to the condition which occurs when a plate 14 with an infinitely large ground resistance 16 is guided in front of the tip 22. On the other hand, if there is located opposite the tip 22 a plate 14 with a relatively low ground or earthing resistance 16 then most of the field lines emanating from the tip 22 migrate to the plate 14 which, however, owing to the rather limited or low value of the ground resistance 16 tends to continuously discharge so that it does not reach any potential which is apreciably greater than ground. Accordingly, the tip 24 of the probe 23 is also practically not influenced, that is to say, at the junction 27 of the voltage divider 25, 26 there appears only a negligibly greater voltage. From what has been explained above it should be apparent that those skilled in the art will have no difficulty in regulating in an empirical manner, on the one hand, the output voltage of the high-voltage generator 18 to a value corresponding to requirements and, on the other hand, to determine that value of the voltage at the junction or tap 27 which is characteristic for a permissible low ground or earthing resistance 16. This voltage value is recorded by the voltmeter 29 and adjusted at the trigger circuit 31, so that upon exceeding this voltage value at the junction 27 a warning signal can be generated, whereas in all instances where the voltage at the junction or tap 27 is lower the coating installation can continue to operate without disturbance. It is to be observed that the apparatus depicted in FIG. 1 also can be employed for switching-off the coating apparatus during such time as there appear gaps or spaces between successive plates 14 which move therepast. The arrangement depicted in FIG. 1 reacts to such gaps or spaces in the same manner as if there were delivered therepast objects with an infinitely high ground resistance.

Figure 2:
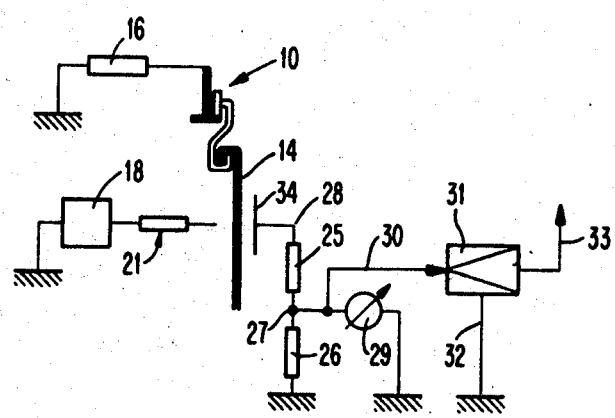
FIG. 2 illustrates an arrangement of apparatus similar to the showing of FIG. 1, wherein here however the spray or corona electrode is arranged at the one side of the object and the induction electrode at the other side of the object.

The exemplary embodiment of FIG. 2 differs from that depicted in FIG. 1 essentially by the features that the spray or corona electrode 21 is arranged at one side of the plate 14 and the measurement circuit employed for determining the ground or earthing resistance is arranged at the other side of the plate 14. Furthermore, with this embodiment there is not employed as the probe any tip, rather there is used a plate 34 which together with the plate 14 which is conducted therepast so-to-speak forms a capacitor. If the plate 14 can be placed at an increased potential by the corona or spray electrode 21 then the plate 14 influences the plate-shaped induction electrode 34 situated opposite thereto which can assume a potential which is dependent upon the potential of the plate 14, and which potential in turn can be measured at the junction or tap 27 of the voltage divider 25, 26. Also this exemplary embodiment can be employed for the purpose of switching-off the coating apparatus during such time as gaps or spaces which exist between successive plates 14 travel past such coating apparatus.

Figures 3, 4:
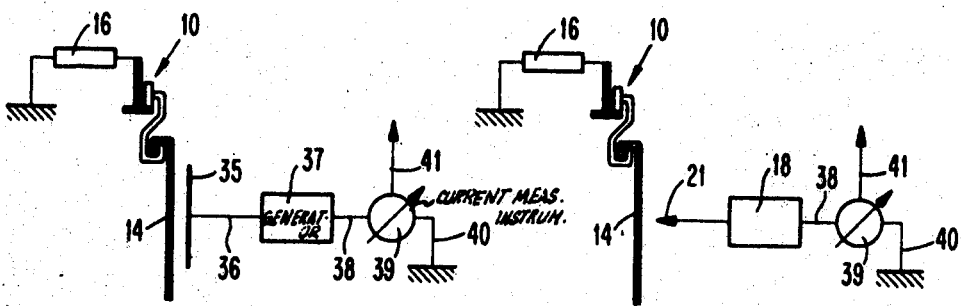
FIGS. 3 and 4 respectively portray two simple arrangements wherein the measuring circuit is directly coupled with the spray or corona electrode.

With the exemplary embodiments depicted in FIGS. 3 and 4 the value of the ground resistance 16 is not determined by means of a voltage measurement, as was the case for the embodiments of FIGS. 1 and 2, rather via a current measurement. In the arrangement of FIG. 3 the plate 14 is arranged opposite a plate electrode 35 which is electrically connected via a line or conductor 36 with a high frequency-low voltage generator 37, the conductor output terminal of which is connected to ground via a conductor 38, a current measuring device or ammeter and a conductor 40. The plate 14 and the plate electrode 35 collectively form a capacitor, the capacitance of which (with given dimensions of the plate 14 and the plate electrode 35) is essentially determined by the spacing between both of these components. Since such spacing, especially with continuously operating coating installations, can be assumed to be constant within narrow limits the current which flows through such arrangement is essentially only dependent upon the value of the ground resistance 16, and specifically the current will become that much greater the smaller the ground resistance. Also with this arrangement it should be understood that those skilled in the art will have no difficulty in determining that minimum value of the current which can be read-off the ammeter or current measuring instrument 39 and which is characteristic for a sufficiently small ground resistance 16. The current measuring instrument 39 can be designed in such a way that upon exceeding such minimum value it delivers a warning signal via a conductor 41 which can be employed to activate an alarm installation and/or switch-out the coating apparatus. Typical values for the high voltage generator 37 are about the following: output voltage 60 volts, frequency controllable in the range of 5000 Hz to 15 kHz.

Finally, the exemplary embodiment of FIG. 4 can be considered to be a combination of the embodiment of FIGS. 1 or 2 and that of FIG. 3. Here the corona discharge current of the corona discharge electrode 21 which is expended by the high voltage generator 18 and determined by the current measuring instrument 39 is employed to determine the value of the ground resistance 16. In reality, with a very high ground resistance 16, after a brief period of time the plate 14 approximately assumes the potential of the corona electrode 21, with the result that the discharge current drops. Also in this case dropping of the discharge current beneath a minimum value to be empirically determined is characteristic for the fact that the plate 14 which just moves past the arrangement possesses an impermissibly high ground resistance.

Figure 5:
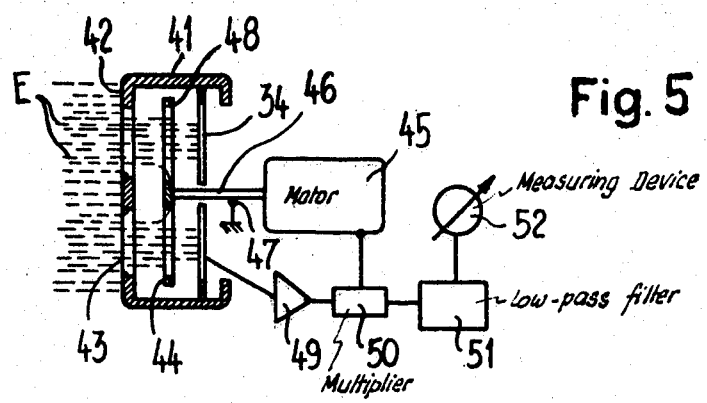
FIGS. 5 and 6 illustrate respective measuring arrangements in which the induction electrode is part of an electrical field intensity-measuring device and wherein for convenience in illustration certain components have been omitted.
Figure 6:
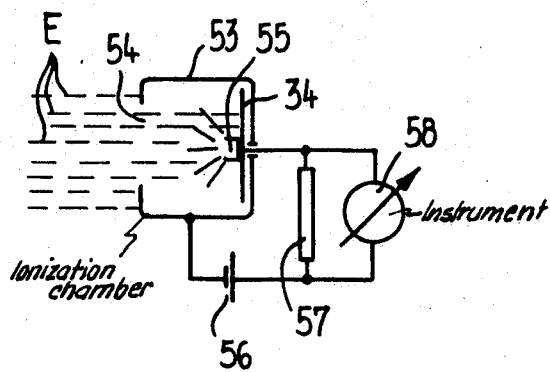

With the measuring arrangement of FIGS. 5 and 6, the induction electrode 34 is a component of a field intensity-measuring device which measures the field intensity of a field emanating from the plates, which have not been particularly shown in FIGS. 5 and 6, and which have remained charged. Upon placement of the discharge electrode at the opposite side of the plate, such measuring arrangements can also be employed for automatically switching-off the coating apparatus as previously described.

With the measuring arrangement of FIG. 5, there can be employed an induction-field intensity-measuring device of the aforementioned Schwenkhagen type. With this device the induction or influence electrode 34 is arranged in a pot-shaped screen 41, at the front plate 42 of which there are cut-out sector-shaped openings 43 which are separated from one another by a like number of similarly formed covering sectors (which are not visible in the drawing). Between the induction electrode 34 which is suspended in insulated fashion in the screening 41 and the front plate 42, there is arranged a chopper disk 44 formed of metal. This chopper disk 44 is seated upon the end of a shaft 46 driven by a motor 45 and is grounded by a connection terminal or point 47. The chopper disk 44 possesses a like number and similarly formed sector-shaped openings 48 as the front plate 42. The field lines E of the plate which remains charged by the corona discharge electrode extend through the openings 43 of the front plate 42 and depending upon the momentary position of the chopper disk 44 terminate either at such or at the induction electrode 34.

This induction electrode 34 is electrically coupled with the input of an alternating current amplifier 49. The output of this amplifier 49 is coupled with a multiplier 50 at which the signals arriving from the amplifier 49 are multiplied by a reference frequency derived from the motor 45 and reproduced by the frequency and phase of the chopper disk 44. Thereafter, the thus produced alternating-current signal is rectified at a low-pass filter 51 and delivered in the form of a direct current voltage to a measuring device 52, and which DC-voltage corresponds in magnitude and sign to the field intensity to be measured.

As already mentioned, the device encompassing the components 34 and 41 to 52 of FIG. 5 have been described in the aforementioned publication and is commercially available on the market as a compact unit.

The advantage of the measuring arrangement of FIG. 5 not only resides in the fact that it is capable of positively determining relatively small field intensities of about 2kV/m, but also in the fact that the measurement value, owing to the pronounced directional characteristics of the induction electrode in the screening, is hardly subject to disturbing influences. Also with this arrangement owing to the electrical field emanating from the object which has remained charged, there can be realized a faultless determination of the ground resistance, wherein owing to the sensitivity of such measuring arrangement the ground resistance can be determined with considerably greater accuracy.

The same is also true in principle for the measuring arrangement of FIG. 6 wherein the induction or influence electrode 34 is arranged internally of an ionization chamber 53. This ionization chamber 53 possesses an opening 54 through which there can enter the field lines E. The interior of the ionization chamber 53, owing to the presence of a radiation source 55, for instance a weak alpha- emitting radiation source or a beta radiation source, possesses a practically constant ion concentration. The radiation source 55 can be integrated or combined with the induction electrode 34 in the manner that such can consist of a conductive, weakly radioactive material, as such for instance can be obtained on the market from the well known United States concern, U.S. Radium Corporation.

By using a low pre-bias, for instance by means of a battery 56, the induction electrode 34 is pre-biased with regard to the ionization chamber 53 so that there always flows through the resistor 57 a limited slight quiescent current and which is limited by the ion concentration and which can be tapped-off via the resistor 57 in the form of a voltage drop.

Now if the field lines E enter the ionization chamber, then they accelerate (or decelerate) the ionic current and produce a change in the electrical current through the resistor 57, which change can be read-off an instrument 58 and is a measure for the direction and magnitude of the field strength of the field emanating from the here also not particularly illustrated object which is electrostatically charged, in the event that its ground resistance is too great to conduct away at the proper time the charge applied by the corona electrode.

It should be readily understood that in conjunction with the proposed measuring arrangement there also can be employed other field intensity-measuring devices to the extent that such operate in a contactless manner. The field intensity measuring devices described in FIGS. 5 and 6 are therefore to be merely considered as exemplary.

While there is shown and described present preferred embodiments of the invention, it is to be distinctly understood that the invention is not limited thereto, but may be otherwise variously embodied and practiced within the scope of the following claims. Accordingly,

What is claimed is:

1. Means for measuring the ground resistance of successive grounded objects which are to be electrostatically coated in a coating apparatus, said coating apparatus including conveying means for moving said objects over a defined conveying path, influencing means proximate to said path for continuously influencing the electrical potential of said objects without contacting the same, and a power source for energizing said influencing means, said measuring means comprising monitoring means for delivering and early warning signal in response to a gradual increase in ground resistance of the objects before the potential of the objects has reached a predetermined value below the breakdown value.

2. Apparatus for measuring as claimed in claim 1, wherein said influencing means consists of a corona discharge electrode.

3. Apparatus for measuring as claimed in claim 1, wherein said monitoring means includes a voltage divider having a tap for connecting to ground, a trigger circuit, means for coupling said tap of the voltage divider with said trigger circuit, and means connected to said trigger circuit for generating a disturbance signal in response to appearance of a voltage in excess of a predetermined value.

4. Apparatus for measuring as claimed in claim 1, wherein said influencing means and said monitoring means are disposed on the same side of said conveying path, and wherein the spacing between both of said means is greater than the spacing between either of said means and said object.

5. Apparatus for measuring as claimed in claim 1, wherein said influencing means and said monitoring means are disposed on opposite sides of said conveying path and at the same height, said monitoring means being in the form of a plate electrode.

6. Apparatus for measuring as claimed in claim 1, wherein said monitoring means comprises a current measuring device adapted to measure the discharge current delivered by said influencing means to an object.

7. Apparatus for measuring as claimed in claim 1, wherein said influencing means and said monitoring means are disposed in a predetermined sequence with respect to said conveying path.

8. Apparatus for measuring as claimed in claim 1, wherein said monitoring means is connected with said influencing means, and wherein said influencing means in a component of an electrical field intensity-measuring device which encompasses the monitoring means.

9. Apparatus for measuring as claimed in claim 8, wherein said electrical field intensity-measuring device consists of an induction-field intensity measuring device.

10. Apparatus for measuring as claimed in claim 8, wherein said electrical field intensity-measuring device consists of an open ionization chamber containing a radioactive source.

* * * * *